United States Patent [19]
Thornber

[11] 4,056,807
[45] Nov. 1, 1977

[54] ELECTRONICALLY ALTERABLE DIODE LOGIC CIRCUIT

[75] Inventor: Karvel Kuhn Thornber, Berkeley Heights, N.J.

[73] Assignee: Bell Telephone Laboratories, Incorporated, Murray Hill, N.J.

[21] Appl. No.: 714,650

[22] Filed: Aug. 16, 1976

[51] Int. Cl.² .......................................... G11C 11/40
[52] U.S. Cl. ............................. 340/166 R; 364/716; 365/191; 365/195
[58] Field of Search ...................... 340/166 R, 173 R

[56] References Cited
U.S. PATENT DOCUMENTS

| | | | |
|---|---|---|---|
| 3,665,423 | 5/1972 | Nakanuma et al. | 340/173 |
| 3,686,644 | 8/1972 | Christensen | 340/173 R |
| 3,728,695 | 4/1973 | Frohman-Bentchkowsky | 340/173 |
| 3,760,378 | 9/1973 | Burns | 340/173 R |
| 3,818,452 | 6/1974 | Greer | 340/166 |
| 3,875,567 | 4/1975 | Yamazaki et al. | 340/173 |
| 3,877,054 | 4/1975 | Boulin et al. | 357/23 |

FOREIGN PATENT DOCUMENTS 1,297,884   11/1972   United Kingdom ............ 340/173 R

OTHER PUBLICATIONS

Nippon Electric Company, Limited Publication Feb. 1972, "256 Bit Programable Mas Rom," pp. 1–8.

Primary Examiner—Donald J. Yusko
Attorney, Agent, or Firm—D. Caplan

[57] ABSTRACT

A crosspoint (X-Y) matrix array of electrically reprogrammable memory logic elements, such as an array of dual dielectric insulated gate field effect transistor (IG-FET) structures, is interconnected in a single electrically reprogrammable diode logic array circuit, both for computing the logic function(s) of many variables and for writing and erasing the function(s). Each logic element's high current path is in series with a separate unidirectional diode in order to prevent sneak paths. Electrical access circuitry is also provided for computing the logic function(s) of many variables, each funtion being electrically alterable.

27 Claims, 4 Drawing Figures

ELECTRONICALLY ALTERABLE DIODE LOGIC CIRCUIT

FIELD OF THE INVENTION

This invention relates to the field of logic circuits, and more particularly to electrically reprogrammable logic circuits in semiconductor integrated circuit configurations.

BACKGROUND OF THE INVENTION

In U.S. Pat. No. 3,818,452 issued to D. L. Greer on June 18, 1974, a reprogrammable logic circuit array of the gated logic type was described. In that circuit, a two-dimensional orthogonal array of crosspoint logic cells contained at each crosspoint a gating element in the form of an IGFET (insulated gate field effect transistor) switching element in series with a programmable memory element in the form of a floating gate transistor. The array was capable of producing an output signal representing the Boolean function of several binary variable input logic signals. However, the array was programmed (written in) by means of avalanche breakdown induced by pulses of high voltage applied across the source and drain (high current carrying) terminals of selected floating gate transistors in the array; and there is no simple way of electrically erasing such an array. Therefore, the flexibility and usefulness of such a logic circuit array is rather limited. Moreover, the logic function access in that array is of the individually gated type, that is, where the binary ("1" or "0"; "true" or "false") logic signal variables are applied to the gate (low current carrying) terminals of the crosspoint IGFET gating elements in the array during computation. However, individually gated type logic arrays are more complex and require more space on the semiconductor chip than diode logic arrays (with a diode at each crosspoint instead of a transistor gate). Although the aforesaid Greer patent also disclosed programmable diode logic arrays, they were not reprogrammable at all. Accordingly, it would be desirable to have a logic circuit array which is electrically reprogrammable and which takes advantage of diode logic.

SUMMARY OF THE INVENTION

An orthogonal X-Y row-column crosspoint array of electronically reprogrammable interconnected logic cells includes at each crosspoint a logic cell consisting essentially of a unidirectional diode element in series with an electrically reprogrammable transistor memory element. For example, each such memory element can be the transistor memory cell described in U.S. Pat. No. 3,877,054 issued to Boulin et al on Apr. 8, 1975. The source terminal of every such transistor memory cell in any given column ($X=a$) are all electrically connected together to a separate column line; and each column line forms a variable input logic signal column line, one such line for each such column of cells. Each such logic signal column line is connected in series through a separate, advantageously unidirectional, column write-enable load element (diode resistor element) to a single common array write-enable selector switch in order to select connection to suitable voltage sources (or ground) for write-enable and logic computation operations for the entire array. Each such load element is of sufficient electrical resistance to support a write-in voltage drop. The drain terminal of every transistor memory element in any given row is connected in series with a different one of the unidirectional diode elements, all having the same sense of current direction, to a logic signal row line corresponding to that row. The gate (low current) electrode of every transistor memory element in any given row ($Y=b$) is connected to a separate write-in gate row line having a terminal which is connected to a selector switch for selecting the given row for connection to a write-in vs. erase vs. logic computation voltage source (or ground). (Source and drain terminals of a transistor are also known as "high current" terminals.)

In a specific embodiment (FIG. 2) of the invention a logic circuit is realized, starting with the above-described X-Y array of interconnected logic cells. This array is further provided with access circuitry suitable for enabling use of the array as an electrically reprogrammable logic array circuit for performing a plurality of selected logic functions of many binary logic variables. Each of the row logic signal lines is connected in series through a separate row line load element to an array-computation-enable selector switch, in order to provide switching between a suitable logic computation-enable voltage source and a write-enable voltage source (including ground) for application to the entire array. Each of the logic signal column lines has a separate terminal connected to a different column logic signal selector switch, in order to provide the binary logic signals for the given column line or to connect a given logic signal column line selectively to a voltage detector or to ground, as desired during operation. In this manner, an electrically reprogrammable logic circuit array is realized which can compute a variety of logic functions of many binary logic variables, the types of functions depending upon the selected settings of the logic signal selector switches and depending upon the preceding programming of each of the memory elements of the logic cells, and the "truth" values of the logic variables determined by the settings of the column logic signal selector switches.

In another specific embodiment (FIG. 1) of the invention, an electrically reprogrammable universal logic circuit is provided in which any one of the $2^{2^n}$ Boolean functions of $n$ binary logic variables can be programmed and computed. This circuit is realized starting with the above-described array of interconnected logic cells, the particular function depending upon the initial programming (write-in) and reprogramming erase plus (rewrite-in) operations. Again, the above-described X-Y array of interconnected logic cells is the basic starting point of the universal logic circuit just as in the above-described reprogrammable logic circuit embodiment. On the other hand, all of the logic signal row lines are connected through a network of binary variable logic row switches to a single array switch for selecting between an array-write-enable voltage source and a computation voltage source for the entire array. Each of the terminals of the logic signal column lines is also connected through a network of binary variable logic column switches to a different write-compute selector switch for selecting between suitable voltage sources (including ground) and voltage detectors for logic computation readout. In this circuit, the type of Boolean function computed is determined by the preceding write-ins of each of the memory elements in the logic cells, whereas the "truth" values of the binary logic variables are determined by the settings in the networks of variable logic row and column switches. In this way, the same Boolean function may be computed repeatedly for different "truth" values of the variables without any intervening write-in or erase (reprogramming).

In all the embodiments of this invention, selection of a logic cell both for programming and for computation is accomplished using the same access lines, thereby conserving space on the chip and reducing the number of external leads.

BRIEF DESCRIPTION OF THE DRAWING

This invention together with its features, advantages, and objects may be better understood from the following detailed description when read in conjunction with the drawings in which.

Figure 1:
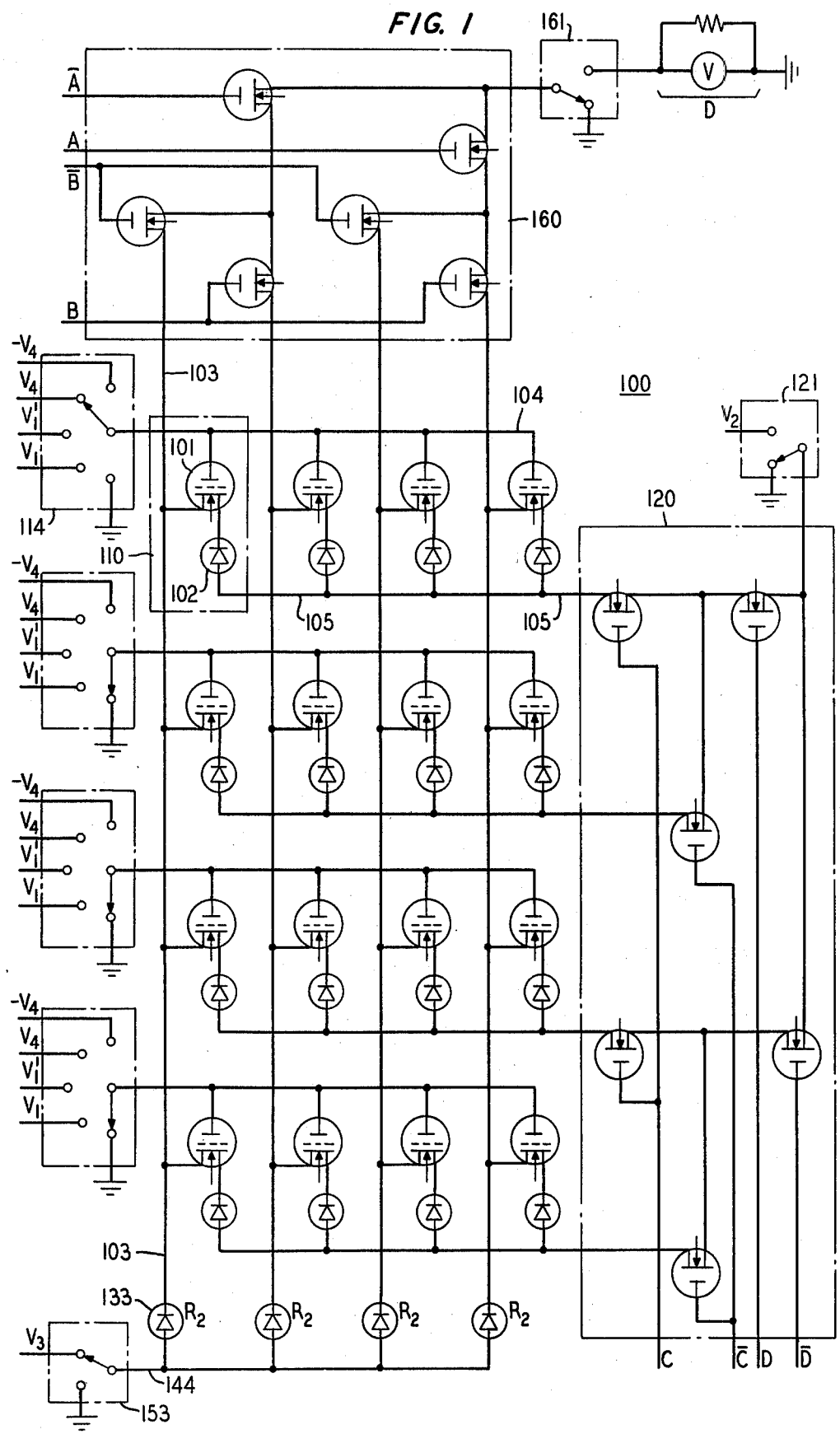
FIG. 1 is a schematic circuit diagram of an electrically reprogrammable universal logic circuit, in accordance with a specific embodiment of the invention.
Figure 3:
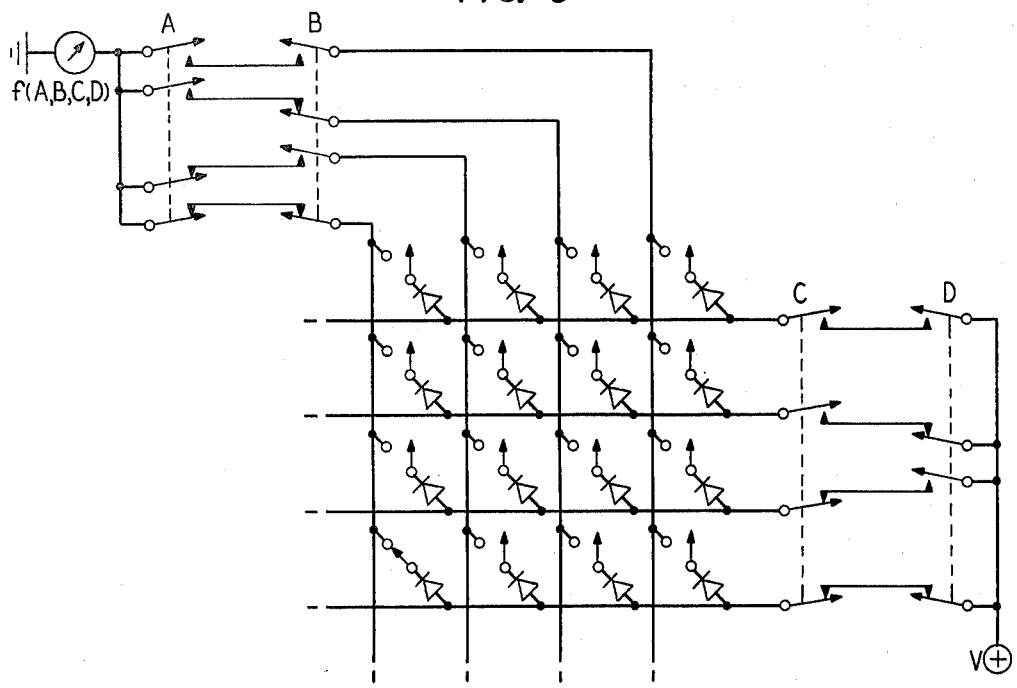
FIG. 3 is a schematic circuit diagram of a universal logic circuit useful in understanding the operation of the logic circuit shown in FIG. 1.

In order to appreciate the structure of the logic circuit 100 shown in FIG. 1 it is first helpful to understand the object to be achieved. This object can be appreciated, for example, by a discussion of the universal logic circuit 300 of FIG. 3. In the circuit 300, any Boolean function f of four variables A, B, C, and D can be programmed and computed as follows. The switches in columns A, B, C, D are set according to the following "true-false" rules of rotation: when a gang of switches in the column corresponding to A, B, C, or D is in the downward throw position, then A, B, C, or D, respectively, is "true" and conversely, when such a column gang of switches is in the upward throw position, then the corresponding logic variable is "false". On the other hand, at each of the row-column crosspoints, the switch at the crosspoint is opened or closed depending upon the desired Boolean function. For example, if and when (as indicated in FIG. 3) the crosspoint switch located at the extreme lower left-hand location is closed while all other crosspoint switches are open, then the resulting output is in accordance with Boolean function f = $\overline{ABCD}$ (the function f is "true" if and only if A, B, C, D are all "false"; and f is false otherwise), that is, the detector shows current if and only if this particular true-false combination of the four variables A, B, C, D is satisfied (as indicated in FIG. 3) by the settings of the switches on columns A, B, C, and D. For another example, the function $f = \overline{A}BCD$ (f is "true" if and only if A is "false", B is "false", C is "true", D is "true", and f is "false" otherwise) can be obtained by opening all crosspoint switches except the extreme upper left-hand crosspoint location. For still another example, by opening all crosspoint switches except the extreme lower left-hand and the extreme upper left-hand crosspoint switches, the function $f = \overline{AB}(CD + \overline{CD})$ can be obtained (f is "true" if and only if both A and B are "false" while C and D are both "true" or both "false"). Similarly, all the $2^{16}$ possible Boolean functions of ABCD can be obtained by means of the corresponding $2^{16}$ possible sets of settings of the 4 × 4 = 16 crosspoint switches. The setting of the crosspoint switches in the circuit 300 (FIG. 3) is the analog of the write-in and erase of the crosspoint memory cells in the circuit 100 (FIG. 1); while the setting of the gang switches in the circuit 300 is the analog of logic computation in the circuit 100.

Referring now to FIG. 1, the universal logic circuit 100 includes a 4×4 row-column X-Y crosspoint array of logic cells, each cell at a different crosspoint. Although these crosspoint logic cells will be described in terms of the extreme upper left-hand crosspoint logic cell 110, it should be understood that all of the other crosspoint cells are similar in structure. The logic cell 110 includes a semiconductor memory IGFET element 101 in series with a semiconductor logic cell diode element 102. For example, the memory IGFET 101 can take the form of the dual dielectric memory transistor structure described in U.S. Pat. No. 3,877,054 issued to Boulin et al on Apr. 8, 1975. Although the voltages and senses of direction of current will be described in terms of N-MOS (N-channel, metal-oxide-semiconductor IGFET) technology, it should be understood that P-MOS, C-MOS (complementary MOS), or D-MOS (double-diffused MOS) technology can also be used in conjunction with appropriate changes in voltage source polarities and in current direction. The dual dielectric IGFET 101 has a first high current (source) terminal connected to an electrically conductive column signal line 103, and has a second high current (drain) terminal connected to one of the terminals of the diode 102 (in the current direction indicated in the drawing). The other terminal of the diode 102, the terminal on the opposite side from the memory IGFET 101, is connected to an electrically conductive row signal line 105. This diode 102 is unidirectional and allows the passage of current only in one direction, specifically in the direction from the diode 102 toward the IGFET 101, while inhibiting current flow in the opposite direction.

The low current (gate) terminal of the IGFET 101 is connected to a write-in gate row line 104. The left-hand end of the write-in gate row line 104 terminates in a gate row write-in switch 114 for switching the gate row line 104 to either a voltage source $V_4$ typically of about 25 to 40 volts, a voltage source $-V_4$ typically of about $-25$ to $-40$ volts, or a voltage source $V_1$ typically of about 5 volts (or alternatively $V_1$ as explained below), or to a ground terminal. Although this switch 114 is indicated in the drawing as a quintuple throw single pole type switch, various arrangements of semiconductor electronic transistor switches can be used for this switching purpose, as known in the art. The row signal line 105 connects the other terminal of every one of the diodes of the cells on the first (top) row to a row logic signal switching array 120. This switching array includes a plurality of IGFET switching transistors whose gate terminals are controlled by the logic values of the binary logic signals C, $\overline{C}$ ($\overline{C}$ = negative of C), D, and $\overline{D}$; that is, the signal C turns its controlled transistors "on" when C is "true" and "off" when C is "false", while the signal $\overline{C}$ turns its controlled transistors "on" when C is "false" ($\overline{C}$ is "true") and "off" when C is "true" ($\overline{C}$ is "false"); and similarly for the logic signals D and $\overline{D}$. In this way, the array 120 performs a similar function as the switches in columns C and D in the circuit of FIG. 3 as previously described. The extreme right-hand switches in the array 120 terminate in a double pole single throw logic computation-enable switch 121 for selecting the connection of the switching transistors of the array between a voltage source $V_2$, typically of about 10 volts, and ground potential.

The column signal line 103 terminates at its upper end in a column logic signal switching array 160, which is similar to the array 120 except that the array 160 is controlled by signals representing the logic values of A,$\overline{A}$,B, and $\overline{B}$. The uppermost switches in the array 160 are connected to a single pole double throw detector switch 161 for selecting the connection of the transistors in this array to a voltage detector D or to ground. The column signal line 103 also terminates in one terminal of a unidirectional impedance element 133, in the form for example of a drain to gate shorted IGFET with relatively high impedance (small channel width to length (Z/L) ratio) as compared with that of the diode 102. This impedance element 133 inhibits substantially completely any tendency of flow of current going down (FIG. 1) the column signal line 103, and presents a sufficient resistance $R_2$ to the flow of current up the column line 103 as to produce a potential drop across itself of almost $V_3 (= V_4/2$ approximately), typically about 12.5 to 20 volts, if and when the top end of the line 103 is grounded while the bottom end of this line is connected to $V_3$. Each of the other column signal lines terminates at the bottom in a separate impedance element substantially identical to the impedance element 133. These impedance elements are connected together at their other terminals to a write-enable line 144 connected to a write-enable switch 153 for selecting connection of the line 144 between $V_3$ and ground potential.

In order to write in a logic cell at a given crosspoint the array of logic cells of the circuit 100, the switches of the arrays 120 and 160 are set by signals A, $\overline{A}$, B, $\overline{B}$, C, $\overline{C}$, D, and $\overline{D}$, such that only the corresponding crosspoint row signal line and the corresponding crosspoint column signal line are connected to the switches 121 and 161, respectively. For example, in order to write in the cell 110, the above-described logic values of logic signals A, $\overline{A}$, B, and $\overline{B}$ are applied to the switching array 160 corresponding to: A is "false" and B is "false"; while signals C, $\overline{C}$, D, and $\overline{D}$ are applied to the switching array 120 corresponding to: C is "true" and D is "true". At the same time the switches 121 and 161 are thrown so as to connect both of these lines to the ground (i.e., the setting shown in FIG. 1); the write-enable switch 153 is thrown to $V_3$ (as in FIG. 1); the gate row switch 114 is thrown to $V_4$ to produce a short pulse, typically 10 microseconds to 10 milliseconds in duration, and all the other gate row switches are thrown to ground (as in FIG. 1). Thereby, the memory IGFET 101, of the crosspoint cell 110, will have both of its high current terminals grounded and its gate terminal at the voltage $V_4$ (sufficient for write-in by charge carrier transport (including tunneling) between the dual dielectric interface and the semiconductor substrate). Since only the cells on the first row have their dual dielectric IGFET gates connected to $V_4$, only these cells have any tendency for write-in by charge transport so as to place negative charges at the dual dielectric interface of the memory IGFET in such cells. (These negative charges will suppress the "on" state of the memory IGFET during logic computation.) On the other hand, all cells on the first row, except for the cell 110, have the top end of their column signal lines floating (because of the "off" signals $\overline{A}$ and $\overline{B}$) and the bottom end of these column signal lines connected to $V_3$ (through corresponding loads $R_2$); therefore, all these other cells (but for cell 110) on the first row have their memory IGFET with their channel regions (of the substrates underlying their dual dielectrics) at an electrical potential substantially equal to $V_3$, which is sufficient to suppress substantially any charge transport otherwise produced by $V_4$. Moreover, since the top end of (only) the extreme left-hand column signal line 103 is grounded while the load 133 has a sufficient resistance $R_2$ to support a voltage drop substantially equal to $V_3$, therefore, the channel region of the substrate of the memory IGFET 101 will be substantially at ground potential and thereby will enable charge transport (including tunneling) between the dual dielectric interface in that memory IGFET and its semiconductor substrate. Thus, a given logic cell in the circuit 100 can be written by the transport phenomenon simply by addressing its gate row line with $V_4$ while all other gate row lines are grounded, while grounding its column signal line through the switching array 160 (by means of appropriate logic values of signals A, $\overline{A}$, B, $\overline{B}$, all other column row lines thereby being kept electrically floating), the write-enable switch 153 being thrown to $V_3$, and while grounding its row signal line (by means of appropriate signals C, $\overline{C}$, D, $\overline{D}$) through the switching array 120 (all other row signal lines floating).

In order to compute a desired Boolean function of binary variable in the logic circuit 100, the desired function is first written into the logic cells one by one, as described above. Then the desired set of logic values of all variables (A, $\overline{A}$, B, $\overline{B}$, C, $\overline{C}$, D, $\overline{D}$) is applied to the corresponding switching arrays 160 and 120 while the logic computation-enable switch 121 is thrown to $V_2$, the write-enable switch 153 is thrown to ground, the gate row switches are all thrown to $V_1$ (sufficient to produce a channel "on" condition in, and only in, the previously nonwritten logic cell memory IGFETs; but not sufficient to turn "on" the previously written cells), and the detector switch 161 is thrown to the voltage detector D. A non-zero reading in D (of substantially $V_2$) indicates a "true" value for the computed Boolean function of the instantaneous values of logic variables A, B, C, D; and a zero reading in D indicates a "false" value for the function of these variables. This follows from the fact that under the applied voltage $V_1$ to the gates with $V_2$ applied to the drains of all the dual dielectric IGFETs, all the nonwritten-in IGFETs will turn "on" while all the written-in IGFETs will stay "off", thereby providing (or not providing) a low resistance current path from $V_2$ to the detector D (depending on the values of A, B, C, D and the write-ins of the various cells). It is thus advantageous that the load elements $R_2$ be unidirectional and prevent current flow from $V_2$ through $R_2$ to ground during logic computation.

In order to reprogram the logic cells (for producing a different Boolean function), a single whole row line can be erased at a time, as follows. In order to erase the first (top) row, the switch 161 is set a ground while the gate-row write-in switch 114 on the first row is thrown to $-V_4$ to produce a short pulse of typically 10 microseconds to 10 milliseconds while all other gate-row write-in switches are thrown to ground at a time when the write-enable switch 153 has been previously thrown to ground as has been the logic computation-enable switch 121, and while appropriate signals C$\overline{C}$D$\overline{D}$ are being applied to the switching array 120 such as to ground at least the row signal line 105. In this way, the memory IGFETs of all logic cells on the first row (and only these cells) will be erased by transport of charges with respect to the substrate in the opposite sense of direction from the previous charge transport during write-in. Thus, the circuit 100 provides an electrically reprogrammable universal logic circuit.

Figure 2:
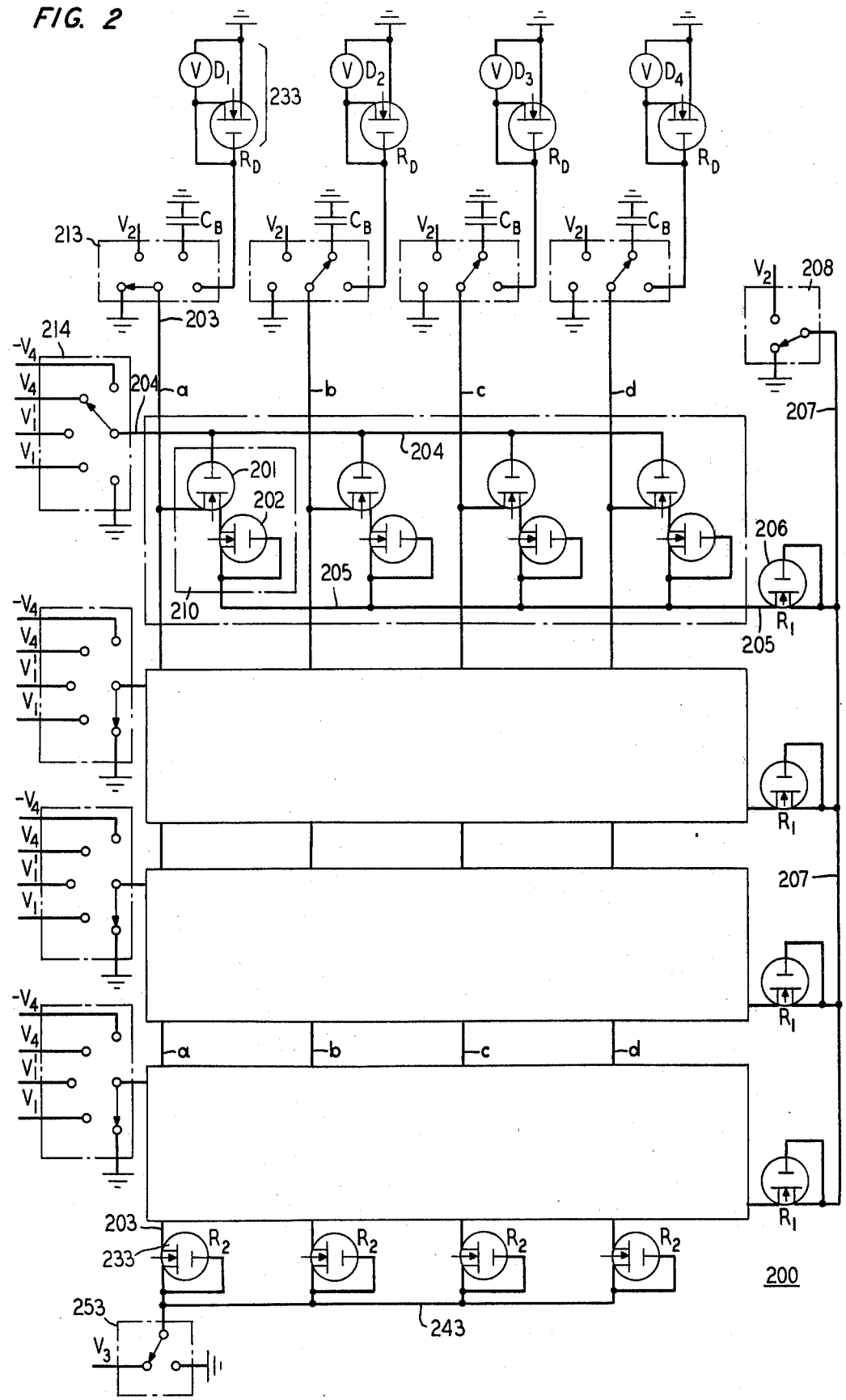
FIG. 2 is a schematic circuit diagram of an electrically reprogrammable diode logic array circuit, in accordance with another specific embodiment of the invention.

Referring now to the logic circuit array 200 of FIG. 2, elements in FIG. 2 that are substantially the same as in FIG. 1 are referenced with the same reference numerals plus 100. Although the crosspoint logic cells in the logic array circuit 200 will be described in detail in terms of the upper left-hand cell 210, again it should be understood that all of the other crosspoint logic cells are similar in structure. As shown in FIG. 2, the logic array circuit 200 includes an array of 4×4 rows and columns of logic cells, each cell including a memory IGFET 201 in series with a semiconductor diode element 202, respectively similar to the memory IGFET 101 and the unidirectional diode 102 in the circuit of FIG. 1. For purposes of illustration only, the diode 202 is shown as an ordinary IGFET whose drain and gate terminals are permanently connected together. The memory IGFET 201 has a first high current (source) terminal connected to an electrically conductive column signal line 203 (also labeled "a"), and has a high current (drain) terminal connected to one of the terminals of the diode 202 in the current direction indicated in FIG. 2. This diode allows the passage of current only in one direction, specifically, in the direction from the diode 202 toward the IGFET 201 in the case of N-MOS technology. A low current (gate) terminal of the dual dielectric IGFET 201 is connected to a write-in gate row line 204. The other terminal of the diode 202, on the opposite side from the memory IGFET 201, is connected to an electrically conductive row signal line 205. The left-hand end of the write-in gate row line 204 terminates in a gate row switch 214 for switching the gate row line 204 to either a write-in or erase source $\pm V_4$ (typically about $\pm 25$ to $\pm 40$-volt sources, respectively), or to a computation-enable source $V_1$ (typically about a 5 volt source) (alternatively to $V_1$ of typically 10 volts), or a ground terminal. Although the switch 214 is indicated in FIG. 2 as a single pole quintuple throw type switch, various arrangements of semiconductor electronic switches can be used for the purpose, as known in the art. The row signal line 205 connects all the diodes of the cells on the first (top) row to one terminal of a unidirectional electrical row load element 206, the other terminal of which is connected to a computation-enable line 207. The upper end of this computation-enable line 207 terminates in a single pole double throw computation-enable switch 208 for connection of the line 207 either to ground or to a voltage source $V_2$ (typically about 10 volts). The column signal line 203 terminates at its upper end in a single pole quadruple throw switch 213 for connection of the line either to ground, or to voltage source $V_2$ or to a column line voltage detector 223 or to an electrically floating condition (a blocking capacitor $C_B$). The detector 223 typically includes a load resistor element $R_D$ in parallel with a voltmeter or voltage detector. The lower end of the column line 203 is connected through a unidirectional column load diode element 233 to a write-enable line 243. This write-enable line 243 is connected to a single pole double throw write-enable switch 253, for switching the line 243 either to a write-in voltage source $V_3$ or to ground.

Each of the unidirectional column load elements (such as 233) has a resistance $R_2$ in the forward (upwards in FIG. 2 for N-MOS) current direction and a substantially infinite (current inhibiting) resistance in the reverse current direction. Each voltage detector (such as 223) has an electrical resistance provided by a separate load resistor $R_D$. All of the unidirectional electrical row load elements (such as 206) have a substantially equal resistance $R_1$ in the forward (right to left for N-MOS in FIG. 2) current direction and a substantially infinite (current inhibiting) resistance in the reverse direction. These directions of current inhibition in FIG. 2 (and FIG. 1) can be determined from the consideration that N-MOS technology is being illustrated and from the indicated electrical shorting of one of the high current (usually drain) terminals of each of the load IGFETs to its gate terminal. In order for this circuit 200 to function properly, it is advantageous that $R_D$ be greater than $R_1$ advantageously by at least a factor of two or more and preferably by a factor of ten or more.

In order to write in a selected logic cell in the circuit 200, for example to write in the logic cell 210 containing the memory IGFET 201, the gate row switch 214 on the corresponding gate row line is thrown to $V_4$ to produce a short pulse, while all other gate row switches are set to ground, at a time when the column signal line switch 213 has been previously thrown to ground and all other column signal line switches have been thrown to a floating condition (i.e., to a blocking capacitor $C_B$). Also, at the same time, the write-enable switch 253 is thrown to $V_3$ while the computation-enable switch 208 is thrown to ground. Thus, only the logic cell 210 will be written by tunneling (or other charge transport) of electrical charges between the substrate and the dual dielectric interface of the memory IGFET structure, for similar reasons as previously discussed in connection with the write-in of the logic cell 110 in the circuit 100 (FIG. 1).

In order to erase a given row of logic cells in the logic circuit array 200, for example the top row of cells (including the cell 210), the corresponding gate row switch 214 is thrown to $-V_4$, while all other gate row switches are thrown to ground, at a time when all other switches have previously been set to ground. In this way, tunneling and other charge transport (in the opposite direction from that during write-in) takes place in, and only in, the memory IGFETs of the given row, thereby erasing all these cells only. Thus, the logic array circuit 200 is fully electronically programmable and reprogrammable.

In order to understand the logic computation operations with the logic circuit 200, it should be noted that any dual dielectric memory IGFET in the circuit 200 which has undergone tunneling in response to $+V_4$ on its gate (and has not been erased, as by applying $-V_4$ to its gate) is in a condition characterized by negative charge trapped at the interface of the two dielectric layers. Accordingly, such a memory element (N-MOS structure) is in the nonconducting "off" state even in the presence of the moderate positive gate voltage $V_1$ during logic computation which is indeed sufficient to turn "on" and induce current flow through any nonwritten memory IGFET element when the logic computation-enable switch 208 is simultaneously thrown to $V_2$ while the column signal line of the nonwritten cell is grounded (but not if the column line of such cell is also connected to $V_2$ through its corresponding column switch).

During the logic computation operations with the logic array circuit 200, the column signal lines are used as logic signal inputs or outputs "a", "b", "c", "d" (as indicated in FIG. 2) depending upon the specific logic operation desired and hence depending upon the throw of the corresponding column signal line switch to ground or to $V_2$, or to the corresponding detector $D_1$, $D_2$, $D_3$, $D_4$, respectively. More specifically, the throw of a column line switch to a detector, such as switch 213 on column line "d" thrown to $D_4$, corresponds to selection of that line "d" as an output line detected by $D_4$; whereas the throw of such a switch on a given column line such as "a" to ground or to $V_2$ selects that line as an input: "a is false" or "a is true", respectively. For example, in order to obtain the logic function $d = abc$, with "d" being the output and "a", "b", and "c" being the inputs, all the cells on all rows except the top row are written (cannot turn "on" during computation), whereas all the cells on the top row are not written or are erased (can indeed turn "on" during computation). If the column switches on column lines "a", "b", and "c" are all thrown to $V_2$ (representing "a", "b", "c" are all "true"); then, if the computation-enable switch 208 has also been thrown to $V_2$ while the column switch on column line "d" has been thrown to the detector $D_4$, under these conditions a detectable current from the source $V_2$ at logic computation-enable switch 208 flows through the computation-enable line 207 and thence through the logic cell located at the crosspoint of the column line "d" and the top row line, to the detector $D_4$, since only the cell at this crosspoint is "on". On the other hand, if all the conditions of the previous sentence are the same except that any one (or more) of the column lines "a", "b" or "c" is connected to ground ("a", "b", or "c" is "false"), then current from the source $V_2$ at computation-enable switch 208 can flow through that (those) IGFET(s) at the crosspoint of the top row and that one (or more) of the column lines "a", "b", or "c", thereby producing a voltage drop across $R_1$ sufficient to prevent appreciable current from flowing through detector $D_4$ ($R_D$ greater than $R_1$) on column line "d". Thus, this mode of operation indeed yields the "AND" logic function $d = abc$, that is, "d" is "true" only if none of "a", "b", or "c" is "false" (i.e., none is connected to ground rather than to $V_2$).

For another example, the logical conjunctive "OR" function $d = a+b+c$ can also be computed with the circuit 200, that is, "d" is "true" if any one (or more) of "a", "b", or "c" is "true". Such a function can be achieved by writing in all cells (nonconducting during readout) except for the cells at the following crosspoints which either are not written or are erased:

1st row, 1st column ("a"); and 1st row, 4th column ("d");
2nd row, 2nd column ("b"); and 2nd row, 4th column ("d");
3rd row, 3rd column ("c"); and b 3rd row, 4th column ("d").

Thereby, only if during computation all the column lines "a", "b", and "c" be switched to ground ("a", "b", "c" are all "false"), will there be a sufficient drop across all of the top three row loads $R_1$ to suppress current through $D_4$; and conversely, if any one of the column lines "a", "b" or "c" be switched to $V_2$, then there will be advantageously much less voltage drop across the particular $R_1$ on the corresponding row connected to that one column line by an erased crosspoint cell, thereby enabling current to flow from the computation-enable line through that non-written crosspoint cell to the detector $D_4$ in response to a throw of the computation-enable switch 208 to $V_2$.

In order to avoid the need for writing in a whole row of cells (FIG. 1 or FIG. 2), during the logic computation any whole row of cells can alternatively be turned "off" (instead of by a previous write-in of that whole row) by connecting the corresonding gate write-in row line to ground. Current in any whole row cells can alternatively be turned "on" (instead of by a previous erase of that whole row) by applying to the corresponding gate write-in row line a voltage $V_1'$ that is approximately equal to $2V_1$, that is, typically 10 volts. It should be understood, of course, that other memory elements than the particular one described above can be used with appropriate adjustments in applied voltages for writing, erasing, and computing.

In using the logic circuit 200, it should be understood that, by connecting a plurality of column lines through their selector switches to their detectors, a plurality of different logic functions of the input logic variables can be computed simultaneously. It should also be understood that the semiconductor substrate is maintained at ground potential. The detectors can, of course, be integrated into other logic circuits, memory circuits, or other types of circuits. Moreover, the column (alternatively row) signal and lines can be used for input variables while the row (alternatively column) signal lines can be used for output variables, with suitable circuit modifications as should be obvious to the worker in the art. The forward (low) resistance of every crosspoint diode in the logic circuits 100 and 200 should advantageously be at least an order of magnitude lower than any of the resistances $R_1$ and $R_D$.

Figure 4:
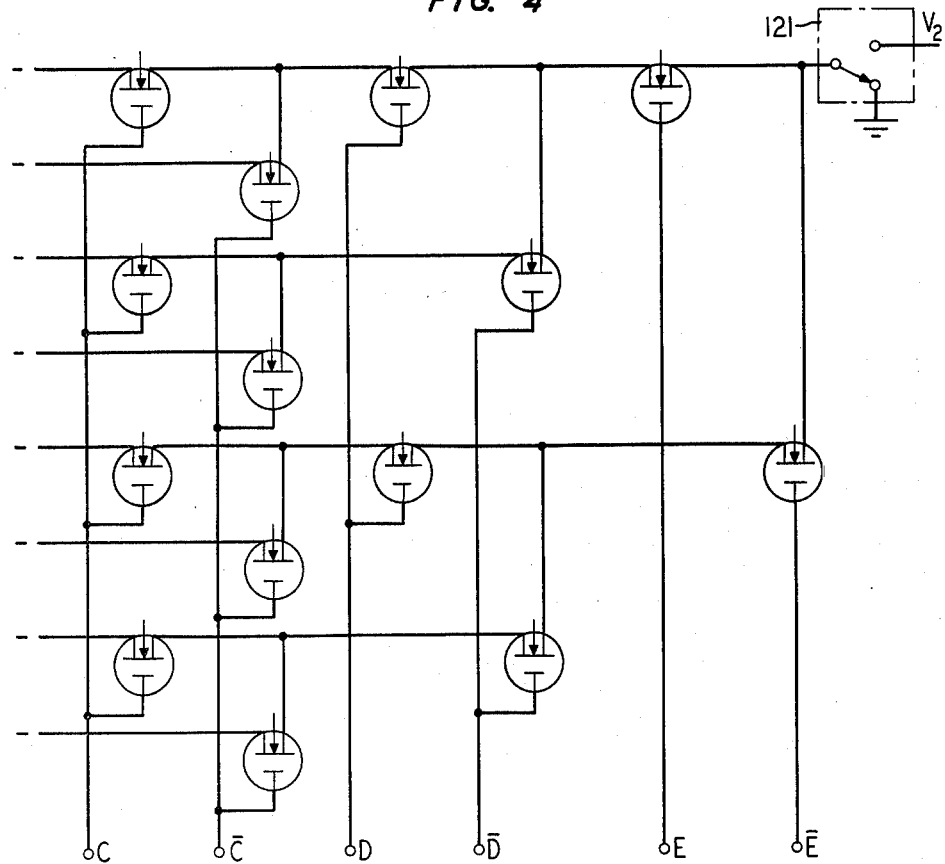
FIG. 4 is a schematic diagram of an array of logic signal switches useful in an alternative embodiment of the universal logic circuit shown in FIG. 1.

Although the invention has been described in detail in terms of specific embodiments, various modifications can be made without departing from the scope of the invention. For example, instead of the 4×4 crosspoint array of cells in the circuit 100, the invention can be extended to M×N crosspoint arrays by, for example, including further switches in each of the arrays 120 and 160, as indicated for example in FIG. 4 for an eight row logic array of such switches of three logic variables C, D, E. Alternatively, of course, P-MOS, C-MOS, or D-MOS technologies can also be used as was the case with the logic circuit 100. Moreover, although the load elements 206 have been described as including the property of unidirectional current inhibition, it is not essential for these load elements to be unidirectional (i.e., ordinary bidirectional resistive loads can be used). For small arrays (less than about 8×8), the load elements can be asymmetrical (or symmetrical) bidirectional resistor elements with individual resistances $R_2$ much greater than $R_D$ (by at least a factor of about ten) for current flowing downwards in FIG. 2 through $R_2$. Also, it is not absolutely essential that the resistance $R_D$ of each detector be larger than that of each row load element $R_1$, it being sufficient that R be at least of the same order of magnitude as $R_1$ (at some sacrifice of margin detection tolerances). Although the write-in and erase voltages have been denoted by $V_4$ and $-V_4$, it should be understood that these voltages need not be equal in magnitude even for equal write-in and erase times, on account of the possible asymmetry of these electronic operations. It is also obvious that the logic circuits 100 and 200, together with their access load elements and switches, may be integrated into a single semiconductor chip in accordance with well-known integrated circuit techniques. Although switching operations have been described in terms of the settings of mechanical switches, electrically controlled transistor switching can be used instead, thereby enabling further integration of electrical elements on a single semiconductor chip in a single system. Finally, it should be recognized that the completely electrically reprogrammable logic circuits of this invention can be incorporated as an integral part of adaptive systems including self-teaching machines or the control logic of a central processing unit of a microprocessor.

What is claimed is:

1. A logic circuit which comprises
   a. a row column array, MxN in number, of three-terminal electrically unidirectional and reprogrammable logic cells, each cell having a first and a second high current carrying terminal and a third low current carrying gate terminal,
   b. a plurality of M first electrically conductive row line means for connecting together the third terminals of all cells in each row to a different gate write-in row terminal,
   c. a plurality of M second electrically conductive row line means for connecting together the first terminals of all cells in each row to a different row line signal terminal,
   d. a plurality of N third electrically conductive column line means for connecting together the second terminals of all cells in each column to a different one of said column lines, each column line connected at one terminal thereof to a different two-terminal column electrical load element for inhibiting current in the opposite sense of direction from said unidirectional cell and each column line having a column signal terminal.

2. The circuit of claim 1 further comprising fourth electrically conductive line means for connecting together a second load terminal of each of the said load elements to a single array write-enable terminal, said load elements each characterized by current inhibition in one sense of direction and by an impedence load for supporting a predetermined write-enable voltage drop in the other sense of direction.

3. The circuit of claim 2 which further comprises a plurality of M write-in gate row switching means each connected to a different one of the gate write-in row terminals, in order to provide voltages to each said row sufficient to program the memory logic state of at least one cell in said row into a first logic state and into a second, different logic state.

4. The circuit of claim 3 which further includes a plurality of N column switching means each connected to a different one of the column line signal terminals, in order to select each column line for connection to a different voltage detector.

5. The circuit of claim 4 in which each of said voltage detectors connected to a given column line through one of said column switching means has an electrical resistance with respect to current flowing in the said one direction that is less than that of the corresponding one of said load elements connected to said one terminal of said column line with respect to said current.

6. The circuit of claim 4 which further comprises a plurality of M row resistance elements, each of said row resistance elements having a first row resistance terminal connected to a different one of the row line signal terminals and a second row resistance terminal mutually connected to every other of the second row resistance terminals, each of said row resistance elements characterized by an electrical resistance that is less than that of the resistance of every voltage detector.

7. The circuit of claim 3 which further comprises row switching means connected to said signal row terminals and column switching means connected to said signal column terminals, for selecting a single logic cell for addressing by an external voltage.

8. The circuit of claim 1 which further comprises a plurality of M write-in gate row switching means each connected to a different one of the gate write-in row terminals, in order to provide voltage to each said row sufficient to program the memory logic state of at least one cell in said row.

9. The circuit of claim 1 which further includes a plurality of N column switching means each connected to a different one of the column line signal terminals, in order to select each column line for connection to a voltage detector.

10. The circuit of claim 1 in which each logic cell consists essentially of a different memory transistor element containing the said low current gate terminal and having a high current path connected in series with a separate unidirectional current inhibitor element.

11. The circuit of claim 10 further comprising fourth electrically conductive line means for connecting together a second load terminal of all the said load elements to a single array write-enable terminal, said load elements each characterized by current inhibition in one sense of direction and by an impedance load for supporting a predetermined write-enable voltage in the other sense of direction.

12. The circuit of claim 11 which further comprises a plurality of M write-in gate row switching means each connected to a different one of the gate write-in row terminals, in order to provide voltage to each said row sufficient to program the memory logic state of at least one cell in said row.

13. The circuit of claim 12 which further includes a plurality of N column switching means each connected to a different one of the column line signal terminals, in order to select each column line for connection to a voltage detector.

14. The circuit of claim 13 in which each of said voltage detectors connected to a given column line through one of said column switching means has an electrical resistance with respect to current flowing in the said one direction that is less than that of the corresponding one of said load elements connected at the opposite end of said column line with respect to said direction.

15. The circuit of claim 14 which further comprises a plurality of M row resistance elements, each of said row resistance elements having a first row resistance terminal connected to a different one of the row line signal terminals and a second row resistance terminal mutually connected to every other of the second row resistance terminals, each of said unidirectional row resistance elements characterized by current inhibition in only one sense of direction.

16. The circuit of claim 15 in which each of said voltage detectors has an electrical resistance that is greater than every one of the said row resistance elements.

17. The circuit of claim 16 which further comprises row switching means connected to said signal row terminals and column switching means connected to said signal column terminals, for selecting a single logic cell connected at the crosspoint of each row and column for application thereto of an external voltage.

18. The circuit of claim 17 which further comprises a plurality of M write-in gate row switching means each connected to a different one of the gate write-in row terminals, in order to provide voltage to each said row sufficient to program the memory logic state of at least one cell in said row.

19. The circuit of claim 18 which further includes a plurality of N column switching means each connected to a different one of the column line signal terminals, in order to select each column line for connection to a voltage detector.

20. Semiconductor apparatus which comprises
   a. a row-column MxN array of three-terminal logic cells, each cell having a different first high current cell terminal and a different second high current cell terminal thereby defining a separate high current path for each cell, each cell consisting essentially of a different electrically programmable semiconductor memory element in series with a separate unidirectional inhibitor element for passing high current through the logic cell between the first and second high current cell terminals only in one sense of direction and inhibiting current in the other sense of direction, each said memory element having a low current cell gate terminal for the application of voltage to program the memory element,
   b. a first plurality, M in number, of electrically conductive row gate line means, each for mutually connecting together the said low current gate terminals of the memory elements in all cells of each row to a different gate write-in row terminal,
   c. a second plurality, M in number, of electrically conductive row line means, each for mutually connecting together the first high current terminals of all cells in each row to a different row line signal terminal,
   d. a third plurality, N in number, of electrically conductive column line means for mutually connecting together the second high current terminals of all cells in each row to a different column line signal terminal and to a column load terminal, and
   e. means for connecting each column load terminal to a first terminal of a different two-terminal column load element for inhibiting current in said one sense of direction.

21. Semiconductor apparatus according to claim 20 in which each memory element is electrically reprogrammable.

22. Semiconductor apparatus according to claim 21 in which each said column load element has a second terminal connected to a common write-enable terminal.

23. Semiconductor apparatus according to claim 22 which further comprises a plurality of M write-in gate row switching means each connected to a different one of the gate write-in row terminals, in order to provide voltage to each said row sufficient to program the memory logic state of at least one cell in said row.

24. Semiconductor apparatus according to claim 23 which further includes a plurality of N column switching means each connected to a different one of the column line signal terminals, in order to select each column line for connection to a voltage detector.

25. Semiconductor apparatus according to claim 24 in which each of said voltage detectors connected to a given column line through one of said column switching means has an electrical resistance with respect to current flowing in a predetermined direction that is less than that of the corresponding one of said column load elements.

26. Semiconductor apparatus according to claim 21 which further comprises a plurality of M write-in gate row switching means each connected to a different one of the gate write-in row terminals, in order to provide voltages to each said row sufficient to program the memory logic state of at least one cell at a time in said row into a first logic state and into a second, different logic state.

27. Semiconductor apparatus according to claim 26 which further includes a plurality of N column switching means each connected to a different one of the column line signal terminals, in order to select each column line for connection to a voltage detector.

* * * * *

UNITED STATES PATENT AND TRADEMARK OFFICE
CERTIFICATE OF CORRECTION

PATENT NO. : 4,056,807
DATED : November 1, 1977
INVENTOR(S) : Karvel K. Thornber It is certified that error appears in the above-identified patent and that said Letters Patent are hereby corrected as shown below:

Column 4, line 44, "$V_1$" should read --$V_1'$--.
Column 7, line 37, "$V_1$" should read --$V_1'$--.
Column 9, line 53, after "and" delete "b".

Signed and Sealed this

Thirtieth Day of May 1978

[SEAL]

Attest:

RUTH C. MASON
Attesting Officer

LUTRELLE F. PARKER
Acting Commissioner of Patents and Trademarks